(12) United States Patent
Ho et al.

(10) Patent No.: US 7,276,751 B2
(45) Date of Patent: Oct. 2, 2007

(54) TRENCH METAL-INSULATOR-METAL (MIM) CAPACITORS INTEGRATED WITH MIDDLE-OF-LINE METAL CONTACTS, AND METHOD OF FABRICATING SAME

(75) Inventors: Herbert L. Ho, New Windsor, NY (US); Subramanian S. Iyer, Mount Kisco, NY (US); Vidhya Ramachandran, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/162,413

(22) Filed: Sep. 9, 2005

(65) Prior Publication Data

US 2007/0057302 A1    Mar. 15, 2007

(51) Int. Cl.
*H01L 29/76* (2006.01)

(52) U.S. Cl. .................. 257/296; 257/299; 257/301; 257/310; 438/238; 438/386; 438/399

(58) Field of Classification Search ............... None
See application file for complete search history.

(56) References Cited

U.S. PATENT DOCUMENTS

| | | | |
|---|---|---|---|
| 5,656,535 A | 8/1997 | Ho et al. | |
| 6,218,693 B1 * | 4/2001 | Lu | 257/296 |
| 6,238,967 B1 * | 5/2001 | Shiho et al. | 438/244 |
| 6,340,615 B1 | 1/2002 | Iyer et al. | |
| 2003/0207532 A1 | 11/2003 | Chudzik et al. | |
| 2004/0130434 A1 | 7/2004 | Chinthakindi et al. | |
| 2004/0248363 A1 | 12/2004 | Bard et al. | |
| 2005/0079724 A1 | 4/2005 | Ho et al. | |
| 2006/0057814 A1 * | 3/2006 | Weis | 438/386 |

* cited by examiner

*Primary Examiner*—Leonardo Andujar
*Assistant Examiner*—Scott Wilson
(74) *Attorney, Agent, or Firm*—Scully, Scott, Murphy & Presser, P.C.; H. Daniel Schnurmann

(57) ABSTRACT

The present invention relates to a semiconductor device that contains at least one trench metal-oxide-metal (MIM) capacitor and at least one other logic circuitry component, preferably at least one field effect transistor (FET). The trench MIM capacitor is located in a trench in a substrate and comprises inner and outer metallic electrode layers with a dielectric layer therebetween. The FET comprises a source region, a drain region, a channel region, and at least one metal contact connected with the source or drain region. The present invention also relates to a fabrication process, which integrates the processing steps for fabricating the trench MIM capacitor with the conventional middle-of-line processing steps for fabricating metal contacts, so that the inner metallic electrode layer of the trench MIM capacitor and the metal contact of the FET or other logic circuitry components are formed by a single middle-of-line processing step and comprise essentially the same metallic material.

19 Claims, 8 Drawing Sheets

TRENCH METAL-INSULATOR-METAL (MIM) CAPACITORS INTEGRATED WITH MIDDLE-OF-LINE METAL CONTACTS, AND METHOD OF FABRICATING SAME

The present invention generally relates to trench metal-insulator-metal (MIM) capacitors that are integrated with middle-of-line metal contacts, and a method for fabricating the same. More specifically, the present invention relates to a semiconductor device that contains at least one trench MIM capacitor and at least one other logic circuitry component, preferably at least one field effect transistor (FET), and a method for fabricating such a semiconductor device, while an inner metallic electrode layer of the trench MIM capacitor and a metal contact of the FET or other logic circuitry component are fabricated by a single middle-of-line processing step and comprise essentially the same metallic material.

BACKGROUND OF THE INVENTION

Embedded memory devices, such as embedded dynamic random access memory (eDRAM), having deep trench capacitors have demonstrated great advantages over planar-stacked device structures. Trench capacitors have replaced the planar storage capacitors in order to meet the scaling demands for high performance dynamic random access memory (DRAM) cell production.

A trench capacitor is a three-dimensional device formed by etching a trench into a semiconductor substrate. After trench etching, a doped region is typically formed in the lower portion of the trench surrounding interior walls of the trench, which serves as an outer electrode or a buried plate electrode of the trench capacitor. A node dielectric is then formed over the outer or buried plate electrode in the trench, which serves as the insulating layer of the trench capacitor, followed by filling the trench, for example, with doped polycrystalline silicon (hereinafter poly-Si), which serves as the inner or upper electrode of the trench capacitor.

One of the major bottlenecks that eDRAM or DRAM technology faces, as the technology scales beyond the 90 nm node, is the parasitic resistance of the trench fill. For example, to write or read a logic level "high" or a state "1," charge on a bitline is either transferred into the trench (write) or the bitline receives charge from the trench (read). The trench fill material, which forms the inner electrode of the trench capacitor, and through which the charge transfers, is typically comprised of heavily $N^+$-doped polysilicon, which has a relatively high electrical resistivity as compared to metals. Further, the trench capacitor is typically connected to an adjacent field effect transistor (FET) in the eDRAM or DRAM device by an out-diffused buried strap that is also highly resistive. The highly resistive poly-Si trench fill material and out-diffused buried strap lead to high parasitic resistance of the trench capacitor, which in turn significantly limits the performance of the eDRAM or DRAM devices, especially on the read/write speed of such memory cells.

For a 90 nm trench capacitor, the trench resistance has been conservatively estimated to be on the order of 20-30 kohms. For a 65 nm trench capacitor, the resistance is projected to increase even further, since the trench size will decrease by approximately 40%, but the resistivity of the poly-Si electrode and the out-diffused buried strap does not scale with the remaining components of trench capacitor. Thus, if the eDRAM or DRAM devices are to be pushed into high-performance memory designs in which static random access memory (SRAM) is firmly entrenched, data access to and from the trench capacitor would have to be enhanced in order for the eDRAM or DRAM devices to qualify as SRAM cache replacement.

There is therefore a continuing need for improved trench capacitor structures that can be readily incorporated into the eDRAM or DRAM devices to reduce the parasitic resistance in such devices and to enhance the performance, especially the read/write speed, of such devices.

There is further a need for a method that can readily integrate the processing steps required for fabricating such improved trench capacitor structures into the eDRAM or DRAM device fabrication processes, with little or no deleterious impact on the performance of other logic circuitry components, such as field effect transistors (FETs), resistors, diodes, planar capacitors, etc., which are formed adjacent to the trench capacitors in the eDRAM or DRAM devices.

SUMMARY OF THE INVENTION

The present invention in one aspect relates to a semiconductor device comprising: at least one trench capacitor that is located in a trench in a substrate, the at least one trench capacitor comprising inner and outer metallic electrode layers with a dielectric layer there between; and at least one field effect transistor (FET) located on the substrate, the at least one FET comprising a source region, a drain region, a channel region, and at least one metal contact connected with the source or drain region, wherein the inner metallic electrode layer of the trench capacitor and the metal contact of the field effect transistor comprise essentially the same metallic material.

The term "metallic" as used herein refers to a structure or component that is formed essentially of a conductive material containing at least one metal in an elemental form, an alloy form, or a compound form. Examples of such conductive material include, but are not limited to: elemental metals, metal alloys, metal nitrides, metal silicides, and mixtures or combinations thereof.

The inner metallic electrode layer of the trench capacitor and the metal contact of the field effect transistor preferably, but not necessarily, comprise at least one metal or metal alloy selected from the group consisting of tungsten, copper, silver, and aluminum.

In a preferred embodiment of the present invention, the inner metallic electrode layer of the trench capacitor is electrically connected to the source or drain region of the FET by a metallic strap. More preferably, the metallic trap comprises a metal silicide or a silicidated metal nitride.

The outer metallic electrode layer of the trench capacitor of the present application preferably, but not necessarily, comprises of a metal silicide or a composite of a metal silicide and a metal nitride. Further, the dielectric layer of the trench capacitor preferably, but not necessarily, comprises a high dielectric material having a dielectric constant of greater than 4.

The trench capacitor and the FET of the semiconductor device of the present invention may be located either in a semiconductor-on-insulator (SOI) substrate or a bulk semiconductor substrate. The metal contact of the FET is preferably connected to a bitline, while the inner metallic electrode layer of the trench capacitor is electrically isolated from the bitline.

A further aspect of the present invention relates to a method for forming a semiconductor device. The method comprises: forming at least one field effect transistor (FET) on a substrate, wherein said at least one FET comprises a source region, a drain region, and a channel region; forming at least two trenches in said substrate, the first of which stops at and exposes the source or drain region of the FET, and the second of which is adjacent to the FET and has a depth larger than that of the first trench; forming an outer metallic electrode layer and a dielectric layer for a trench capacitor in the second trench; and filling both the first and second trenches with a metallic material to concurrently form an inner metallic electrode layer for the trench capacitor and a metal contact for the FET.

Preferably, the FET is covered by at least one middle-of-line insulator layer and at least one dielectric capping layer before formation of the trenches.

During formation of the outer metallic electrode layer of the trench capacitor, a metallic strap is preferably formed on a sidewall of the second trench. The metallic strap is electrically connected to the source or drain region of the FET, and the subsequently formed inner metallic electrode layer of the trench capacitor is electrically connected to the source or drain region of the FET by the metallic strap.

A still further aspect of the present invention relates to a semiconductor device, which comprises: at least one trench capacitor that is located in a substrate, said at least one trench capacitor comprising inner and outer metallic electrode layers with a dielectric layer therebetween; and at least one metal contact connected with at least one logic circuitry component selected from the group consisting of transistors, resistors, diodes, planar capacitors, and varactors, wherein said at least one logic circuitry component is covered by at least one insulator layer, wherein said at least one metal contact is located in a trench in said at least one insulator layer, and wherein the inner metallic electrode layer of the trench capacitor and the at least one metal contact comprise essentially the same metallic material.

Other aspects, features and advantages of the invention will be more fully apparent from the ensuing disclosure and appended claims.

DETAILED DESCRIPTION OF THE INVENTION, AND PREFERRED EMBODIMENTS THEREOF

Figure 1:
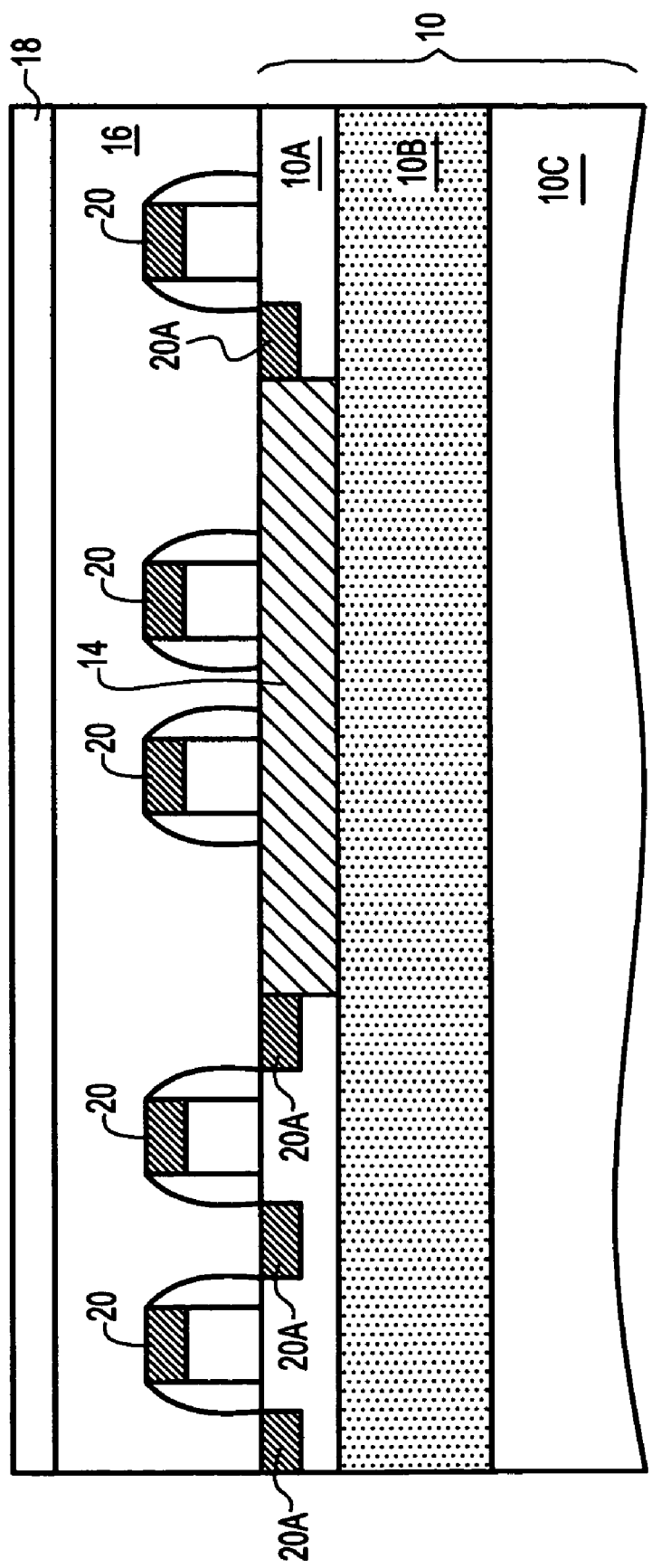
FIGS. 1-8 are cross-sectional views that illustrate the processing steps for forming an exemplary semiconductor device having integrated trench MIM capacitors and FETs, according to one embodiment of the present invention.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" another element, it can be directly on the other element or intervening elements may also be present. In contrast, when an element is referred to as being "directly on" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present invention provides a solution to the parasitic series resistance problem associated with eDRAM or DRAM devices that contain the conventional trench capacitors having the high resistivity poly-Si electrodes and being connected to adjacent FETs by the high resistivity out-diffusion buried straps, as described hereinabove. Specifically, the present invention provides improved trench capacitors with metallic electrodes, which have significantly lower resistivity than that of the poly-Si electrodes in the conventional trench capacitors.

The trench capacitors of the present invention may be incorporated into eDRAM or DRAM devices that also contain transistors or other logic circuitry components, such as resistors, diodes, planar capacitors, etc. The trench capacitors are preferably connected to adjacent logic circuitry components (preferably FETs) in the eDRAM or DRAM devices by metallic straps of relatively low resistivity, in comparison with the conventional out-diffusion buried straps. The trench capacitors of the present invention may also be used in other applications, such as decoupling capacitors and so on, while having metallic electrodes raise the frequency of operation and improve the linear response in such other applications.

While forming deep trench capacitors with metal electrodes rather than doped polysilicon electrodes may appear to be a logical progression in the advance of such devices, introduction of metal into deep trench capacitors creates unique manufacturing obstacles, which have halted any actual progression in this direction.

For example, in the current process-of-record (POR), the deep trench capacitors are typically formed in the semiconductor substrate prior to construction of any other logic circuitry components (including active devices such as transistors and passive devices such as resistors, diodes, planar capacitors, and varactors), in order to minimize any adverse impact on logic device characteristics. Introducing metal to the semiconductor substrate or exposing the substrate to a metal-processing tool before construction of the logic circuitry components greatly magnifies the risk of metal contamination and the impact thereof on the device performance, because the high temperature front-end-of-line (FEOL) processing steps required for fabrication of logic circuitry components increase metal diffusion rate in eDRAM or DRAM junctions and allow any metal atoms present in the semiconductor substrate to migrate into the active region of the chip and deteriorate the logic circuitry components. Metal contamination of $5.0 \times 10^{16}/cm^3$ or higher in the eDRAM or DRAM junctions would render the cells inoperative. Further, the metal electrodes of the deep trench capacitors may not be able to withstand the high temperatures of the FEOL processing steps, which will create leakage within the eDRAM or DRAM cells. Moreover, integrating metals early into the wafer fabrication process may also lead to a manufacturing liability. Hot FEOL processing tools, such as furnaces, are particularly susceptible to metal contamination, which can negatively impact the production yield.

The present invention therefore provides a method for integrating the processing steps required for fabricating the trench MIM capacitors into the conventional eDRAM or DRAM device fabrication processes, while minimizing the risk of metal contamination or migration during the FEOL fabrication of the logic circuitry components. The trench capacitors formed by the method of the present invention have unique metallic electrodes. For example, the outer electrodes of the trench capacitors of the present invention preferably comprise a metal silicide, while the inner electrodes preferably comprise an elemental metal. By integrating the processing steps for fabricating the trench MIM capacitors into conventional middle-of-line (MOL) processing steps typically used for fabricating metal contact modules for logic circuitry components, such as FETs, resistors, diodes, planar capacitors, etc., the method of the present invention successfully forms high performance trench MIM capacitors, using virtually the same tool set as those used for the metal contact modules, with little or no damage to the active regions of adjacent logic circuitry components in the eDRAM or DRAM devices.

Specifically, the present invention first forms at least one FEOL logic circuitry component, preferably an FET, without introducing any metal species and thus minimizing the risk of metal contamination or migration during the FEOL process. Then, a trench MIM capacitor and a metal contact for the logic circuitry component are formed in the substrate, while the logic circuitry component is protected, for example, by one or more MOL insulator layers and/or one or more capping layers. Particularly, the inner metallic electrode of the trench MIM capacitor and the metal contact for the logic circuitry component are concurrently formed by a single processing step, and therefore comprise essentially the same metallic material.

Such a method, as well as the resulting semiconductor device structure, will now be described in greater detail by referring to the accompanying FIGS. 1-8.

Note that in these drawings, which are not drawn to scale, like and/or corresponding elements are referred to by like reference numerals. Further, although FETs, which are the preferred logic circuitry components to be integrated with the trench MIM capacitors in the present invention, are predominantly shown hereinafter, it is understood that other logic circuitry components, such as diodes, resistors, planar capacitors, varactors, etc., can also be integrated with the trench MIM capacitors by using processing steps similar to those illustrated hereinafter, with slight modifications that can be readily determined by a person ordinary skilled in the art depending on specific application requirements.

It is also to be noted that in the drawings, only five FETs and two trench capacitors are shown on/in a semiconductor substrate. Although illustration is made to such an embodiment, the present invention is not limited to the formation of any specific number of trench capacitors, FETs, and other logic circuitry components.

Reference is first made to FIG. 1, which shows transistors 20 fabricated on a semiconductor substrate 10, which contains one or more shallow trench isolations 14. The semiconductor substrate 10 may comprise any semiconductor material including, but not limited to: Si, SiC, SiGe, SiGeC, Ge alloys, GaAs, InAs, InP, other III-V or II-VI compound semiconductors. In some embodiments of the present invention, it is preferred that the semiconductor substrate 10 be composed of a Si-containing semiconductor material, i.e., a semiconductor material that includes silicon. Further, the semiconductor substrate 10 may be doped, undoped, or contain both doped and undoped regions therein (not shown). The doped device regions are typically known as "wells".

Semiconductor substrate 10 may comprise a bulk semiconductor structure, a layered semiconductor structure such as Si/SiGe, or a semiconductor-on-insulator structure. FIG. 1 specifically shows a semiconductor-on-insulator (SOI) substrate 10 that contains a semiconductor layer 10A, a buried insulator layer 10B, and a semiconductor base layer 10C. The buried insulator layer 10B may comprise a crystalline or an amorphous oxide or nitride, with an amorphous oxide being preferred. While this embodiment of the invention is illustrated using an SOI substrate, it is understood that the present invention can be easily extended to a bulk semiconductor substrate, and the possible difference in process steps for the SOI substrate and the bulk semiconductor substrate, if any, will be mentioned at the appropriate steps to be described hereinafter.

The shallow trench isolation regions 14 are formed into the semiconductor layer 10A of the SOI substrate 10, to provide isolation between doped device regions. The shallow trench isolation regions 14 can be readily formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process. The shallow trench isolation regions 14 can extend to the buried insulator layer 10B, as is shown in FIG. 1, or they may not extend down to the surface of layer 10B.

The transistors 20 are preferably field effect transistors (FETs), which may contain various essential or optional FET components, such as wells, source/drain halo and/or extension regions, source/drain regions, gate dielectric, gate electrode, source/drain/gate metal silicides, gate spacers, etc. (not shown). In addition, and specifically for the eDRAM array, a high energy N-type implant (not shown), which preferably consists of phosphorus, is provided in the well module (not shown) of the transistors 20. This implant is needed to electrically connect the trench capacitors (which are to be formed subsequently) together and to bias the outer electrode layers (to be formed subsequently) of the trench capacitors to ground. The transistors 20 can be readily formed by conventional front-end-of-line (FEOL) processing steps, which include, but are not limited to: deposition, lithography, etching, implantation, etc. A replacement gate process can also be used.

The source/drain regions 20A of the transistors 20 are formed either in the semiconductor layer 10A as embedded structures shown in FIG. 1, or over the semiconductor layer 10A as raised source/drain (not shown). Preferably, but not necessarily, metal silicide contacts (not shown) have been formed over surfaces of the source/drain regions 20A, as well as surfaces of the gate electrodes (not shown), of the transistors 20.

A thin barrier layer (not shown), which is typically about 25-75 nm (preferably about 50 nm) thick and which preferably comprises silicon nitride, is deposited over the entire structure, including the transistors 20, followed by deposition of one or more MOL insulator layers 16 and one or more capping layers 18. The MOL insulator layer(s) 16 and the capping layer(s) 18 may contain any suitable dielectric material(s), including, but not limited to: silicon dioxides, silicon nitrides, silicon oxynitrides, boron doped phosphorus silicate glass (BPSG), phosphosilicate glass (PSG), etc. Preferably, the MOL insulator layer(s) 16 and the capping layer(s) 18 contain BPSG or undoped low temperature oxide that is formed by any suitable dielectric deposition processes, including, but not limited to: high density plasma deposition (HDP), plasma-enhanced chemical vapor deposition (PECVD), etc. Preferably, the MOL insulator layer(s) 16 and the capping layer(s) 18 are formed by an HDP process.

In the present invention, the MOL insulator layer(s) 16 and the capping layer(s) 18 function to: (1) act as barriers between the transistors 20 and metal layers to be deposited subsequently, so as to prevent migration of the metal species into active regions of the transistors 20 and to protect the transistors 20 against potential metal contamination, and (2) act as masks for forming deep trenches in the semiconductor substrate 10 for subsequent fabrication of the trench capacitors. The MOL insulator layer(s) 16 may have a thickness ranging from about 5000 Å to about 7000 Å or greater, depending on the specific application requirements. Preferably, MOL insulator layer(s) 16 thicker than 6000 Å may be used in the present invention in order to provide a robust dielectric cover for the transistors 20 or other logic circuitry components during the trench capacitors and metal contacts fabrication process.

Figure 2:
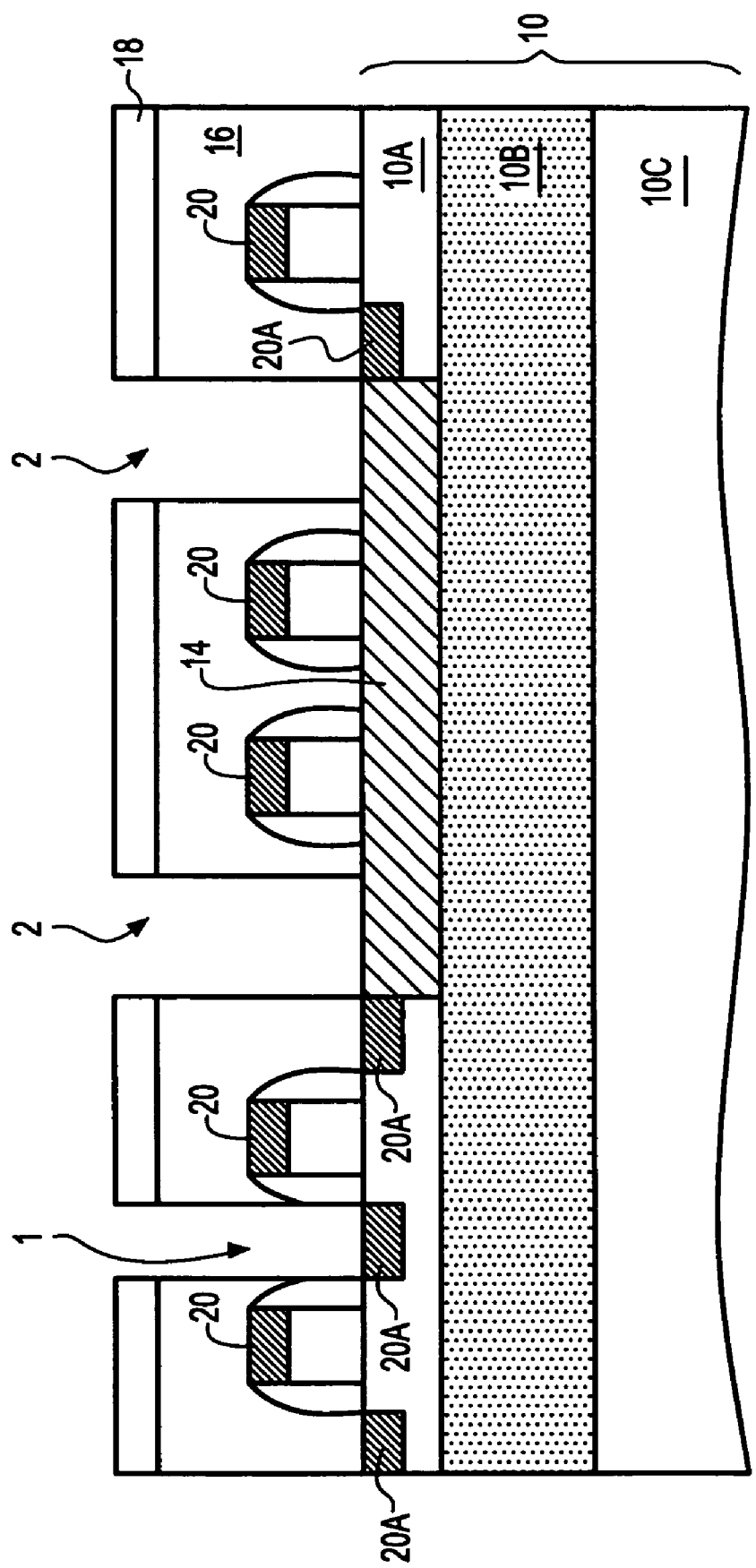

FIG. 2 shows formation of metal contact (CA) holes or vias 1 and trench openings 2 in the MOL insulator layer(s) 16 and the capping layer(s) 18, by using photolithography and etching steps typically used for forming CA contact holes in a conventional middle-of-line process. Specifically, a photoresist (not shown) is applied over the capping layer(s) 18. The photoresist can be applied by any suitable technique, including, but not limited to: coating or spin-on techniques. A mask (not shown), which is patterned with shapes defining CA contact holes and trench openings to the formed, is provided over the photoresist, and the mask pattern is transferred to the photoresist using a photolithographic process, which creates recesses in the uncovered regions of the photoresist. The patterned photoresist is subsequently used to create the same pattern of recesses in the capping layer(s) 18 and the MOL insulator layer(s) 16, through conventional POR etching typically used for forming CA contact holes. The POR etching selectively removes a portion of the capping layer(s) 18 and the MOL insulator layer(s) 16 and stops at the thin barrier layer (not shown) underneath the MOL insulator layer(s) 16. After formation of the CA contact holes 1 and the trench openings 2, the photoresist may be stripped from the capping layer(s) 18.

Optionally, a thin silicon nitride spacer (not shown) is formed along each sidewall of the CA contact holes 1 in order to protect the MOL insulator layer(s) 16 from subsequent wet/dry etching.

Figure 3:
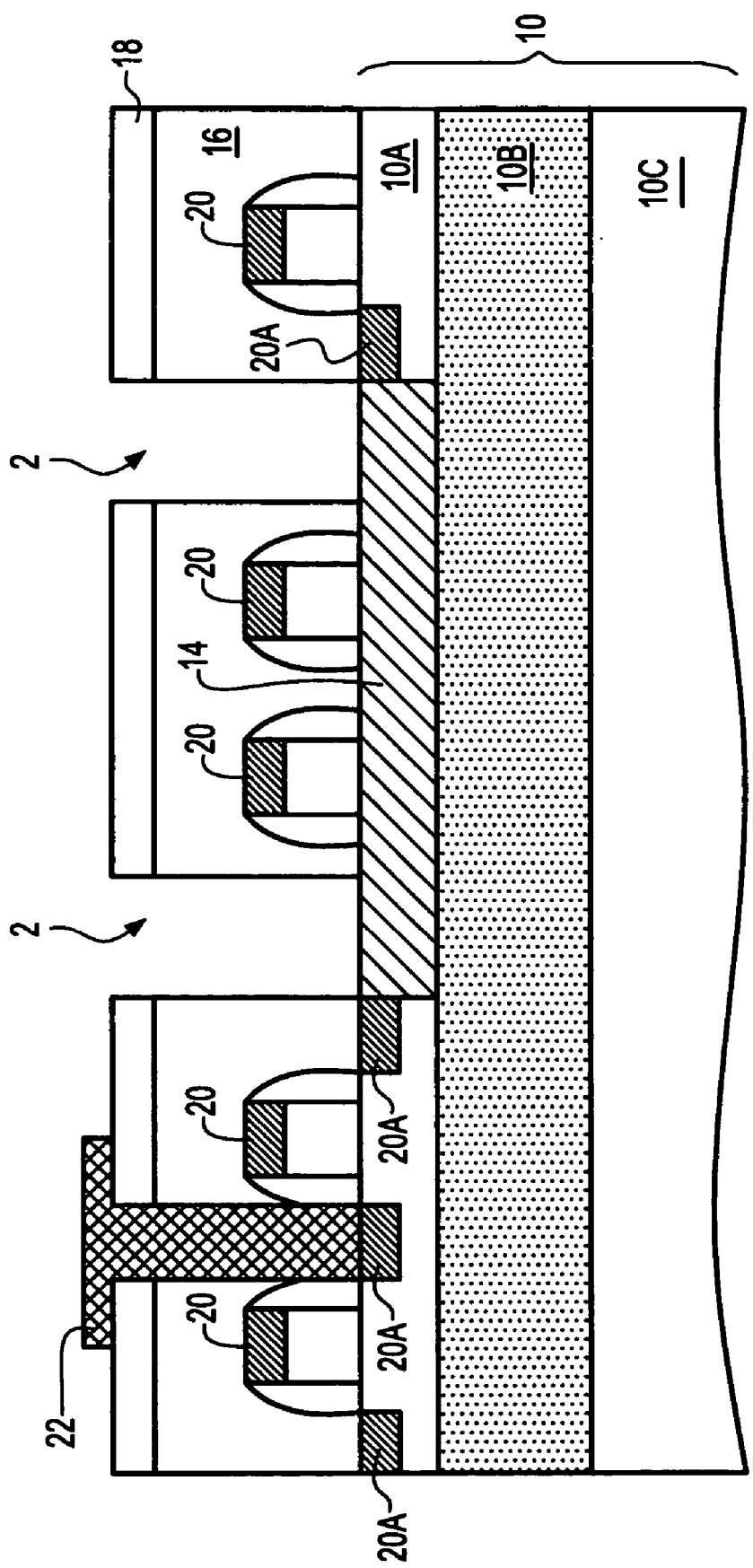
Figure 4:
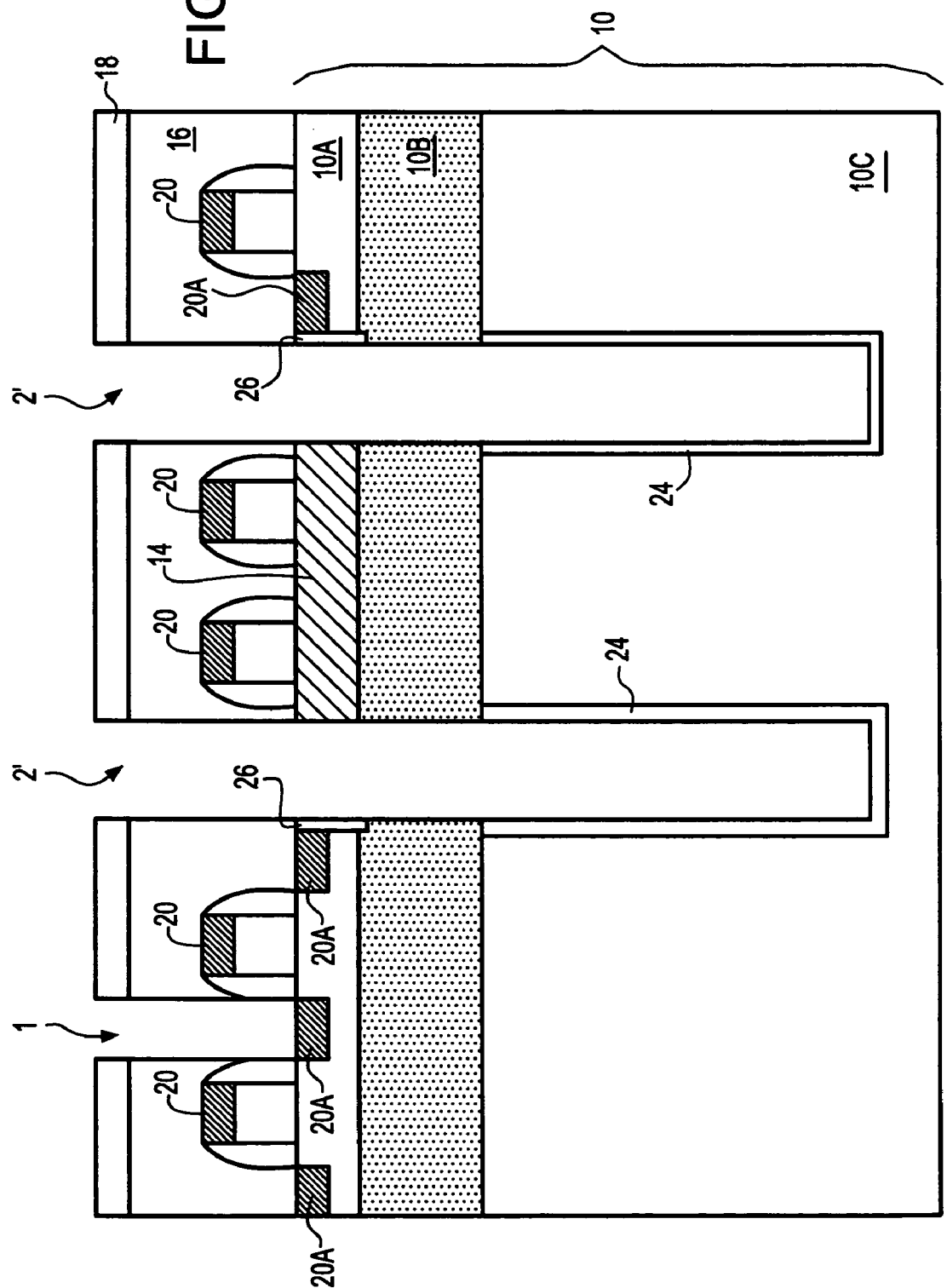

Next, a photoresist block mask 22, as shown in FIG. 3, is formed in the CA contact holes 1 to protect the CA contact holes 1 from subsequent trench etching. After formation of the photoresist block mask 22, the trench etching process, which is preferably a plasma-based reactive ion etching (RIE) process or any other dry etching process, is carried out to etch the trench openings 2 and to form deep trenches 2' that extend through the semiconductor layer 10A and the buried insulator layer 10B to the semiconductor base layer 10C, as shown in FIG. 4. Preferably, the deep trenches 2' have an average depth of about 1 to 10 μm, and more preferably of about 1 to 3 μm, as shown in FIG. 4. The photoresist block mask 22 can be removed from the CA contact holes 1 by stripping after formation of the deep trenches 2'.

Subsequently, outer metallic electrode layers 24 for the trench capacitors are formed in the bottom and over the sidewalls of the deep trenches 2' in the semiconductor base layer 10C of the substrate 10. Further, metallic straps 26 are formed over the sidewalls of the deep trenches 2' in the semiconductor layer 10A, adjacent to and in connection with the source/drain regions 20A of the transistors 20. The outer metallic electrode layers 24 and the metallic straps 26 preferably comprise a metal silicide such as $TiSi_2$, $CoSi_2$, NiSi, and/or a metal nitride such as TiN or TaN. Such outer metallic electrode layers 24 and the metallic straps 26 are preferably formed by silicidation.

Specifically, a metal layer (not shown), which comprises a metal that can react with silicide to form metal silicide (e.g., Ti, Co, Ni, Ta, etc.), is deposited over the entire structure. The preferred thickness of the metal layer ranges from about 100 Å to about 500 Å, more preferably from about 50 Å to about 100 Å. Such a metal layer can be readily deposited by any suitable deposition technique, including, but not limited to: atomic layer deposition (ALD), chemical vapor deposition (CVD), and physical vapor deposition (PVD). The deposition process preferably provides sufficient sidewall coverage in the deep trenches 2', so that the metal layer is continuous. The metal layer may be deposited alone, or together with a metal nitride capping layer (not shown) containing TiN or TaN and having a thickness ranging from about 50 Å to about 500 Å, preferably from about 100 Å to about 200 Å.

After deposition of the metal layer and/or the metal nitride capping layer, the entire structure is annealed at a predetermined elevated temperature at which the deposited metal layer reacts with exposed silicon on the sidewalls of the deep trenches 2' to form metal silicides of relatively low contact resistance, which in turn forms the outer metallic electrode layers 24 and the metallic straps 26, as shown in FIG. 4. The annealing is typically performed in an inert gas atmosphere, e.g., He, Ar, $N_2$, or forming gas, at relatively low temperatures ranging from about 100° C. to about 600° C., preferably from about 300° C. to about 500° C., and most preferably from about 300° C. to about 450° C., by using a continuous heating regime or various ramp and soak heating cycles. Unreacted metal and/or TiN are removed after formation of the outer metallic electrode layers 24 and the metallic straps 26.

For certain metals such as Co or Ti, a second annealing step may be employed to form metal silicides of lower resistivity, such as $CoSi_2$ or $TiSi_2$. Specifically, after deposition of the metal layer, a first annealing step is employed to form a metal silicide of a first silicide phase (e.g., CoSi or TiSi) of higher resistivity. Next, the unreacted metal is removed, followed by a second annealing step carried out at a different annealing temperature to consume the remaining silicon and to convert the metal silicide from the first silicide phase to a second silicide phase (e.g., $CoSi_2$ or $TiSi_2$) of lower resistivity.

Further, if the semiconductor layers 10A and 10B do not contain silicon, a patterned silicon layer (not shown) can be formed in the deep trenches over the regions at which the outer metallic electrode layers 24 and the metallic straps 26 are to be formed, prior to deposition of the metal layer.

Note that a thin silicon nitride spacer (not shown) has been previously formed along each sidewall of the CA contact holes 1. This thin silicon nitride spacer also functions to prevent formation of metal silicide in the CA contact holes 1 during the silicidation process.

In the event that the semiconductor substrate 10 contains a bulk semiconductor substrate, instead of the SOI structure as shown in FIGS. 1-4, extra processing steps are necessary, so that the outer metallic electrode layers 24 can be effectively isolated from the metallic straps 26 in order to prevent shorting therebetween (note that in the SOI structure, the buried insulator layer 10B provides the vertical isolation necessary between the outer metallic electrode layers 24 and the metallic straps 26). One way to provide the necessary vertical isolation is to recess the outer metallic electrode layers 24 below the metallic straps 26, with sufficient vertical distances therebetween. Therefore, a photoresist recess process can be carried out immediately after deposition of the metal layer but before the annealing process. Specifically, the deep trenches 2' are first filled with a photoresist, followed by a resist recess etching step and a wet etching step, preferably a nitric-acid-based etching step, which selectively removes a portion of the metal layer from the upper portion of the deep trenches 2'. The remaining metal layer is then annealed to form the outer metallic electrode layers 24, while metal silicides (not shown) in the source/drain regions 20A of the transistors 20 function as the metallic straps that connects the trench capacitors to be formed and the transistors 20. Further, a high-energy (on the order of about 150 KeV or greater) p-well can be implanted into the bulk semiconductor substrate to electrically connect the trench capacitors together and to prevent shorting between the outer metallic electrode layers 24 and the $N^+$-doped drain regions of the transistors 20.

Figure 5:
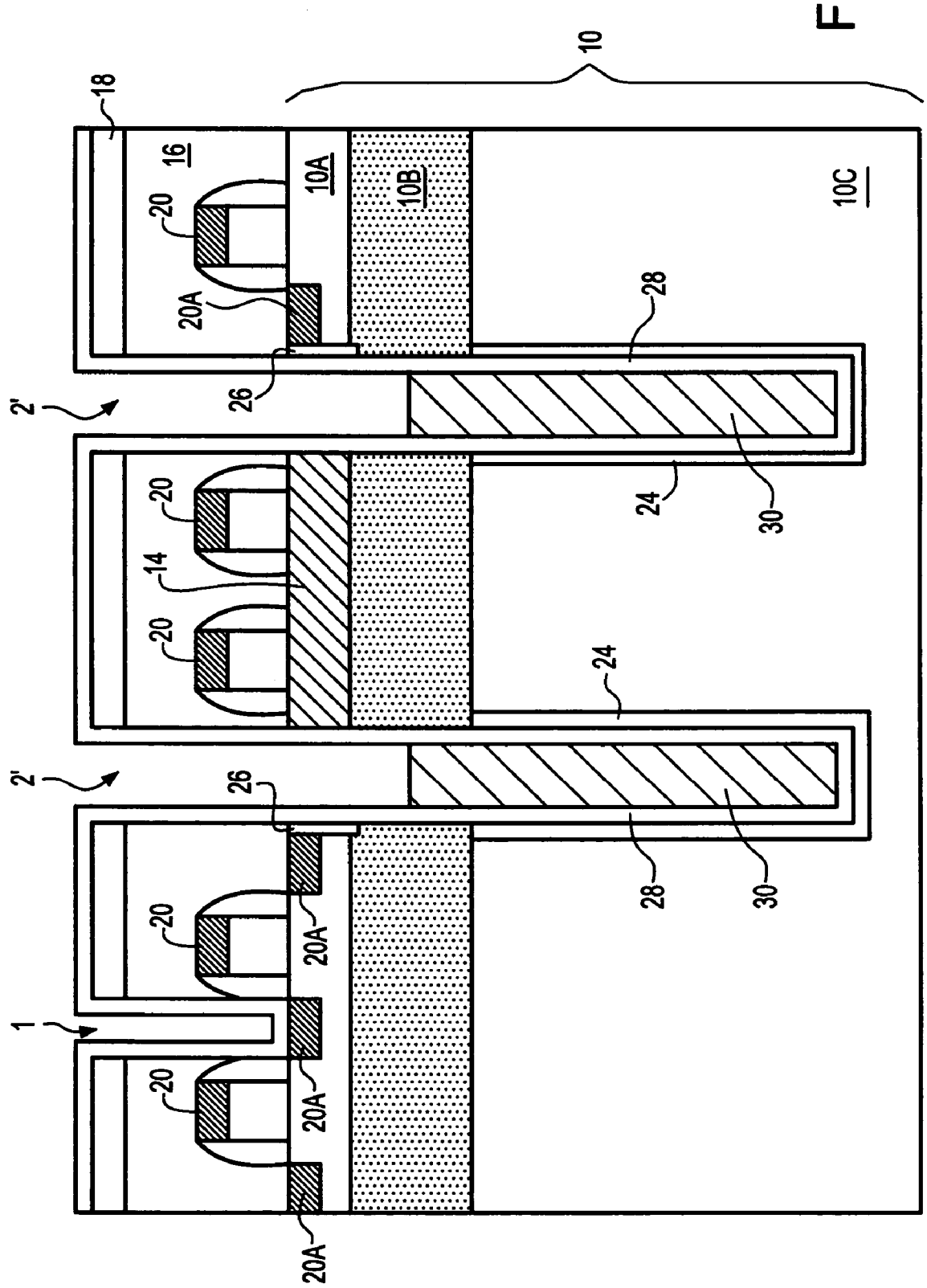

After formation of the outer metallic electrode layers 24, a node dielectric film 28 is deposited over the entire structure, as shown in FIG. 5. The node dielectric film 28 may comprise any dielectric material, including, but not limited to: silicon oxide, aluminum oxide, hafnium oxide, barium strontium oxide, etc. Preferably, the node dielectric film 28 comprises a high-k (i.e., k>4.0) dielectric material, such as aluminum oxide ($Al_2O_3$) and hafnium oxide ($HfO_2$), which allows use of relatively shallow trenches for achieving a required capacitance for the trench capacitors, e.g., about 20 fF, thereby reducing the required device processing time. The node dielectric film 28 may be deposited by any suitable dielectric deposition techniques, including, but not limited to: ALD, CVD, and PVD. The thickness of the node dielectric film 28 preferably ranges from about 40 Å to about 500 Å.

Once the node dielectric film 28 has been deposited, a photoresist (not shown) is applied to fill the CA contact holes 1 and the deep trenches 2', followed by a resist recess etching step, which completely removes the photoresist in the CA contact holes 1 and recesses the photoresist in the deep trenches 2' to below the semiconductor layer 10A at about ⅔ depth of the buried insulator layer 10B, thereby forming a recessed photoresist 30 in deep trenches 2', as shown in FIG. 5. The resist recess depth may vary widely, depending on the device specification. Preferably, the resist recess depth ranges from about 6000 Å to about 6500 Å.

Figure 6:
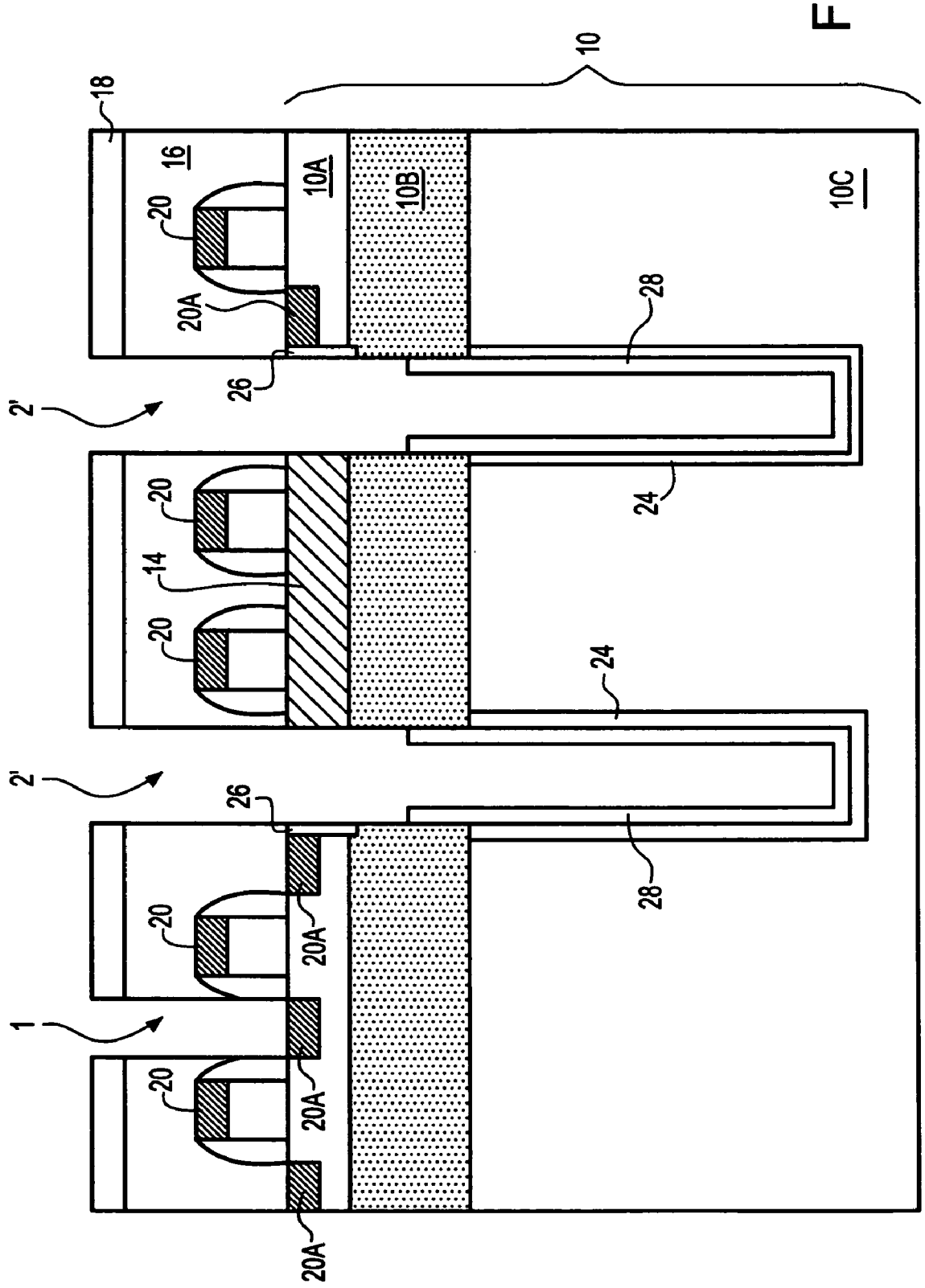

Subsequently, a further isotropic etching step is carried out using the recessed photoresist 30 as a mask to selectively remove an upper portion of the node dielectric film 28, so as to form a node dielectric layer 28 that is recessed below the semiconductor layer 10A at about ⅔ depth of the buried insulator layer 10B, as shown in FIG. 6. Preferably, an HF-based etching solution is used for etching of the node dielectric film 28 selective to the recessed photoresist 30. During this etching step, the thin silicon nitride spacer along each sidewall of the CA contact holes 1, as mentioned previously, protects the CA contact holes 1 from the HF-based etching solution. After etching, the recessed photoresist 30 is stripped from the deep trenches 2', followed by an optional cleaning step to prepare the deep trenches 2' for metal filling.

Figure 7:
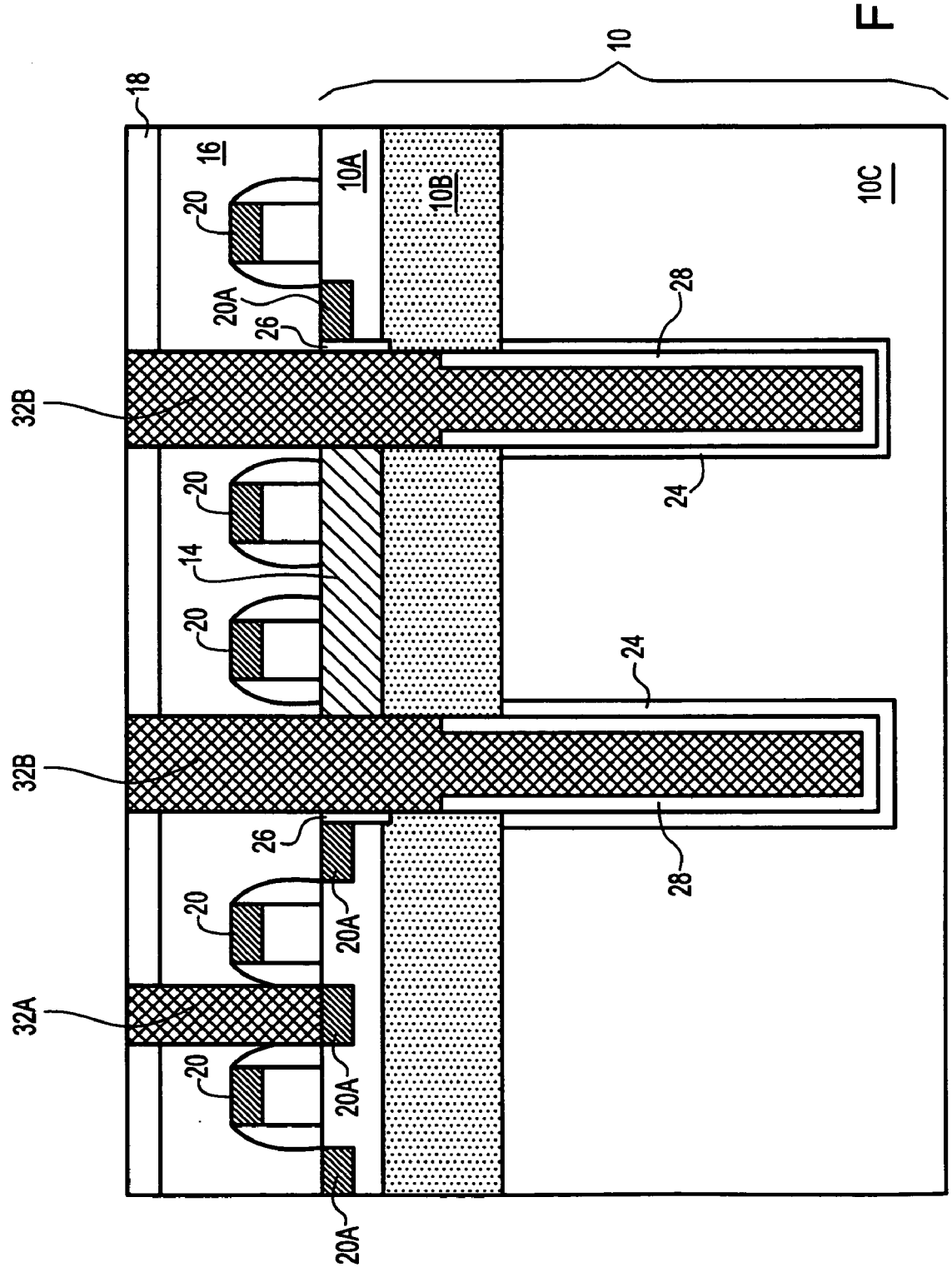

FIG. 7 shows deposition of a metallic material in the CA contact holes 1 and the deep trenches 2' to form CA contacts 32A, which are connected with the source/drain regions 20A of the transistors 20, and inner metallic electrode layers 32B for the deep trench capacitors. The metallic material preferably comprises at least one metal or metal alloy selected from the group consisting of tungsten, copper, silver, aluminum, etc. In this manner, the CA contacts 32A for the transistors 20 and the inner metallic electrode layers 32B for the deep trench capacitors are formed by a single process step, and they consist of essentially the same metallic material. One or more planarization steps may be carried out to remove metallic material outside the CA contact holes 1 and the deep trenches 2'.

Figure 8:
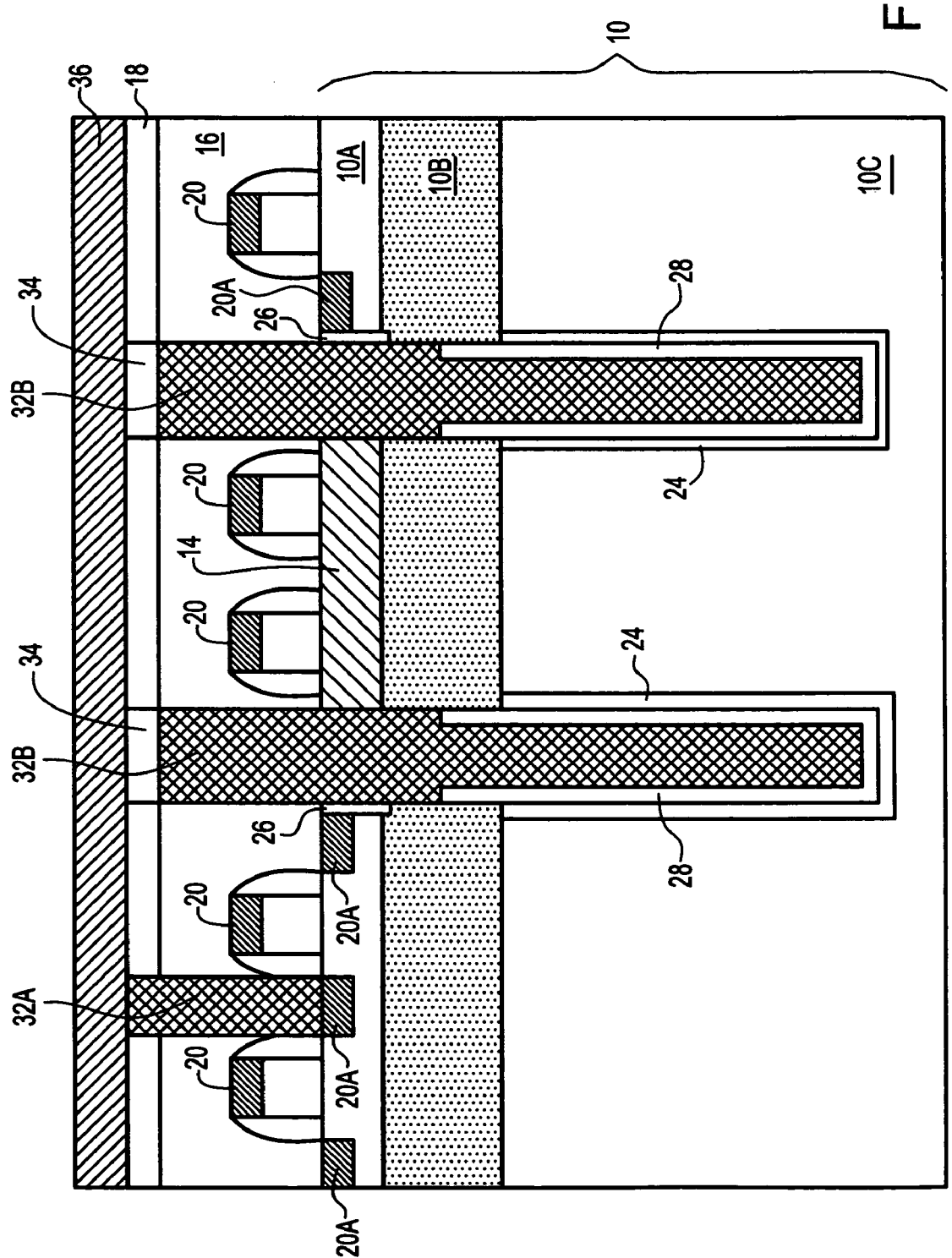

Further processing steps can be carried out for forming a bitline 36, to which the CA contacts 32A are connected, as shown in FIG. 8. In order to prevent the inner metallic electrode layers 32B of the trench capacitors from shorting to the bitline, an additional etching process can be carried out, by first applying a photoresist mask (not shown) over the entire structure before formation of the bitline 36 and then patterning the photoresist mask to cover the CA contact holes 1 while exposing the deep trenches 2', followed by RIE etching of the inner metallic electrode layers 32B in the deep trenches 2'. In this manner, recesses 34 are formed in the inner metallic electrode layers 32B, which function to electrically isolate the inner metallic electrode layers 32B from the bitline 36 subsequently formed.

The device structure shown in FIG. 8 therefore contains transistors 20 with metal contacts 32A and metal-insulator-metal (MIM) trench capacitors with outer electrodes 24, node dielectric 28, and inner electrodes 32B. Further, the transistors 20 and the MIM trench capacitors are connected by metallic straps 26. At this point, the processing of the trench capacitors and the metal contacts is complete, and additional conventional back-end-of-line (BEOL) processing steps can be carried out to complete the device structure.

The outer/inner electrodes 24 and 32B of the MIM trench capacitors of the present invention have reduced resistivity, in the order of 100× to 200×, in comparison with the poly-Si electrodes of conventional trench capacitors. Further, the metallic straps 26 have reduced resistivity, in the order of 10× to 20×, in comparison with conventional $N^+$-polysilicon straps. Therefore, the overall resistance of the MIM trench capacitors of the present invention is significantly lower than that of conventional trench capacitors.

Further, the structure and process of the present invention are suitable for use in the 45 nm node and beyond, because the lower resistance of the trench fill and strap is suitable for further scaling of the trench size and allows formation of smaller high-performance eDRAM or DRAM cells.

Moreover, the method of the present invention simplifies the processing steps required for integrating the trench MIM capacitors by (1) using the same mask layers, including the middle-of-line insulator layers and/or capping layers, for forming the CA contact holes and the trench openings, (2) using conventional CA contact etching steps for forming the trench openings for the trench capacitors, and (3) combining formation of the CA contacts with the inner electrodes of the trench MIM capacitors in a single processing step.

The processing steps described hereinabove therefore form trench capacitors that have metallic electrodes and can be readily integrated into the middle-of-line contact modules of a CMOS process flow. By introducing metal species to the semiconductor wafer after formation of the transistors and in conjunction with formation of the middle-of-line metal contacts, the problem associated with metal contamination and migration is solved, which allows incorporation of MIM trench capacitors into the eDRAM or DRAM devices that also contain other logic circuitry components, such as FETs.

In summary, the present invention fulfills the need for high-density trench capacitors with low series resistance and good linearity, which can be fabricated at relatively lower costs and complexity, with little or no interference with the active device process flow.

While FIGS. 1-8 illustratively demonstrates several exemplary processing steps that can be used to form a device structure according to a specific embodiment of the present invention, it is clear that a person ordinarily skilled in the art can readily modify such process steps as well as device structures so formed for adaptation to specific application requirements, consistent with the above descriptions. For example, while the trench capacitors as illustrated hereinabove are designed for use as memory capacitors in the eDRAM or DRAM technology, it is clear that a person ordinarily skilled in the art can readily modify the trench capacitors of the present invention for use in other applications where capacitors are needed, such as decoupling capacitors, filters, etc. It should therefore be recognized that the present invention is not limited to the specific embodiment illustrated hereinabove, but rather extends in utility to any other modification, variation, application, and embodiment, and accordingly all such other modifications, variations, applications, and embodiments are to be regarded as being within the spirit and scope of the invention.

What is claimed is:

1. A semiconductor device comprising:
    at least one trench capacitor located in a trench in a substrate, said at least one trench capacitor comprising inner and outer metallic electrode layers with a dielectric layer therebetween;
    at least one field effect transistor (FET) located on said substrate, said at least one FET comprising a source region, a drain region, a channel region, and at least one metal contact connected with the source or drain region, wherein the inner metallic electrode layer of the trench capacitor and the metal contact of the field effect transistor comprise essentially the same metallic material; and
    at least one metallic strap located beneath a top surface of said substrate and directly contacting both said inner metallic electrode layer and one of said source region and said drain region, wherein a top surface of said inner metallic layer is located above said at least one metallic strap.

2. The semiconductor device of claim 1, wherein the inner metallic electrode layer of the wench capacitor and the metal contact of the field effect transistor comprise at least one metal or metal alloy selected from the group consisting of tungsten, copper, silver, and aluminum.

3. The semiconductor device of claim 1, wherein the metallic strap comprises a metal silicide or a silicidated metal nitride.

4. The semiconductor device of claim 1, wherein the outer metallic electrode layer of the trench capacitor comprises a metal silicide or a composite of a metal silicide and a metal nitride.

5. The semiconductor device of claim 1, wherein the dielectric layer of the trench capacitor comprises a high dielectric constant material having a dielectric constant of greater than 4.

6. The semiconductor device of claim 1, wherein the substrate comprises a semiconductor-on-insulator structure.

7. The semiconductor device of claim 1, wherein the substrate comprises a bulk semiconductor structure.

8. The semiconductor device of claim 1, wherein the metal contact of the FET is connected to a bitline.

9. The semiconductor device of claim 8, wherein the inner metallic electrode layer of the trench capacitor is electrically isolated from said bitline.

10. A method for forming a semiconductor device comprising:
    forming at least one field effect transistor (FET) on a substrate, wherein said at least one FET comprises a source region, a drain region, and a channel region;
    forming at least two trenches in said substrate, the first of which stops at and exposes the source or drain region of the FET, and the second of which is adjacent to the FET and has a depth larger than that of the first trench;
    forming an outer metallic electrode layer and a dielectric layer for a trench capacitor in the second trench; and
    filling both the first and second trenches with a metallic material to concurrently form an inner metallic electrode layer for the trench capacitor and a metal contact for the FET.

11. The method of claim 10, wherein the FET is covered by at least one middle-of-line insulator layer and at least one dielectric capping layer before formation of the trenches.

12. The method of claim 10, wherein the inner metallic electrode layer of the trench capacitor and the metal contact of the field effect transistor comprise at least one metal or metal alloy selected from the group consisting of tungsten, copper, silver, and aluminum.

13. The method of claim 10, wherein during formation of the outer metallic electrode layer of the trench capacitor, a metallic strap is formed on a sidewall of the second trench, wherein said metallic strap is electrically connected to the source or drain region of the FET, and wherein the subsequently formed inner metallic electrode layer of the trench capacitor is electrically connected to the source or drain region of the FET by said metallic strap.

14. The method of claim 13, wherein the metallic strap comprises a metal silicide or a composite of metal silicide and metal nitride.

15. The method of claim 10, wherein the outer metallic electrode layer of the trench capacitor comprises a metal silicide or a silicidated metal nitride.

16. The method of claim 10, wherein the substrate comprises a semiconductor-on-insulator structure.

17. The method of claim 10, wherein the substrate comprises a bulk semiconductor structure.

18. The method of claim 10, wherein the metal contact of the FET is connected to a bitline, and wherein the inner metallic electrode layer of the trench capacitor is electrically isolated from said bitline.

19. A semiconductor device comprising:
    at least one trench capacitor that is located in a substrate, said at least one trench capacitor comprising inner and outer metallic electrode layers with a dielectric layer therebetween, wherein a top surface of said inner metallic electrode layer is located above a top surface of said substrate; and
    at least one metal contact connected with at least one logic circuitry component selected from the group consisting of transistors, resistors, diodes, planar capacitor, arid varactors, wherein said at least one logic circuitry component is covered by at least one insulator layer, wherein said at least one metal contact is located in a trench in said at least one insulator layer, and wherein the inner metallic electrode layer of the trench capacitor and the at least one metal contact comprise essentially the same metallic material.

* * * * *